United States Patent [19]

Iwai

[11] Patent Number: 4,613,230
[45] Date of Patent: Sep. 23, 1986

[54] WAFER EXPOSURE APPARATUS

[75] Inventor: Hiroshi Iwai, Takaidonishi, Japan

[73] Assignee: Tokyo Shibaura Denki Kabushiki Kaisha, Japan

[21] Appl. No.: 373,629

[22] Filed: Apr. 30, 1982

[30] Foreign Application Priority Data

May 6, 1981 [JP] Japan .................................. 56-67911
Sep. 22, 1981 [JP] Japan .................................. 56-149865

[51] Int. Cl.⁴ ..................... G03B 27/42; G03B 27/52; G03B 27/70
[52] U.S. Cl. ........................................ 355/53; 355/43
[58] Field of Search ...................... 355/43, 53, 86, 95

[56] References Cited

U.S. PATENT DOCUMENTS

| 3,907,425 | 9/1975 | Isamu et al. ...................... 355/53 X |
| 4,172,656 | 10/1979 | Lacombat et al. ..................... 355/53 |
| 4,418,467 | 12/1983 | Iwai ................................ 356/401 X |
| 4,422,755 | 12/1983 | Phillips ................................. 355/43 |
| 4,452,526 | 6/1984 | Johannsmeier et al. .............. 355/43 |

Primary Examiner—Fred L. Braun
Attorney, Agent, or Firm—Finnegan, Henderson, Farabow, Garrett & Dunner

[57] ABSTRACT

A wafer exposure apparatus for covering the entire surface of a wafer with an array of desired chip patterns in a step and repeat process of projecting the desired chip pattern on a wafer by using a mask having the desired chip pattern. An alignment mark or chip specification mark is provided to a predetermined region of the wafer by a mask other than the mask having the desired chip pattern.

3 Claims, 16 Drawing Figures

F I G. 7
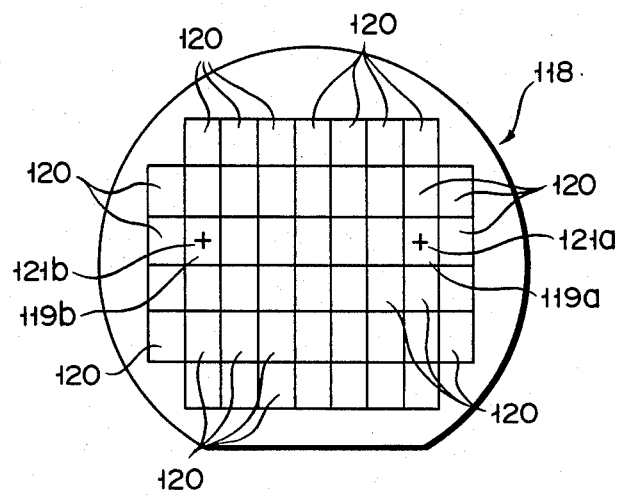

WAFER EXPOSURE APPARATUS

BACKGROUND OF THE INVENTION

This invention relates to a wafer exposure method adopting a step and repeat exposure method of a projection system, particularly a reduction projection system and an apparatus for carrying out the same.

With the progress of high integration LSI techniques, the importance of microlithography is increasing. The precision of microlithography greatly depends upon the performance of the exposure apparatus. Recently, the performance of the exposure apparatus has been strikingly improved, and step and repeat exposure apparatus of projection type, particularly reduction projection type, has been developed and is regarded to be an effective apparatus for lithography of line widths of the order of 1 μm.

FIG. 1 shows the construction of a well-known step and repeat exposure apparatus. Referring to FIG. 1, to the top of a stage 1 which is movable in X- and Y-direction, is secured a wafer chuck 2 for securing a wafer to the stage 1. Above the stage 1, an optical column 3 including an optical system for reducing mask patterns is disposed. The optical column 3 is provided near the edge of its top with two marks 4a and 4b for being aligned with alignment marks of a mask to be described later. Right above the optical column 3, a light source 5 is disposed at a predetermined distance therefrom. Further, the optical column 3 is provided with an alignment system 6 on its side wall. The alignment system 6 includes a body 7 provided at the bottom with marks 8a and 8b for being aligned with the alignment marks of the mask to be described later and microscopes 9a and 9b provided on top of the body 7 for observing the state of alignment with the marks 8a and 8b with the alignment marks of the wafer. In the alignment system 6 of this kind, a mirror or a half mirror may be provided between the marks 8a and 8b and the microscopes 9a and 9b, and an alignment monitor 10 uses the mirror or half mirror to observe the state of alignment between the marks 8a and 8b and the alignment marks of the alignment mask of wafer. The side of the stage 1 and the side of the optical column 3 are provided with marks 11a and 11b for effecting alignment of the two in the Y-direction.

Now, the method of wafer exposure with the reduction projection type step and repeat exposure apparatus described above will be described. The mask 12 is aligned with the optical column 3 by aligning the alignment marks 13a and 13b provided on a mask 12 having a desired mask pattern with the marks 4a and 4b provided on the optical column 3 near the edge of its top. With the reduction projection exposure system described above, the mask pattern of the mask 12 is projected on a reduced scale on a wafer. Therefore, with the reduction of the mask pattern the out-of-alignment between the mask 12 and optical column 3 is also reduced, and thus alignment departure from the alignment between the mask 12 and optical system 3 gives rise to no problem.

After the wafer 14 is secured to the wafer chuck 2, alignment between the wafer 14 and alignment system 6 is effected. More particularly, alignment marks 15a and 15b provided on the wafer 14 are aligned with the marks 8a and 8b of the main body 7 by moving the wafer 14 while observing it with the microscopes 9a and 9b or the alignment monitor 10. The alignment system 6 is secured to the optical column 3 at a predetermined position thereof, and thus the wafer 14 is indirectly aligned with the optical column 3 and mask 12.

After the alignment between the wafer 14 and alignment system 6 has been completed, the stage 1 is moved in the Y-direction along a rail (not shown) to effect alignment between the stage 1 and optical system 3 such that the wafer 14 is positioned directly beneath the optical column 3 as shown by double dot and bar line in FIG. 1. The alignment between the stage 1 and optical column 3 in the Y-direction may be automatically effected with a laser interferometer by making use of the mark 11a of the stage 1 and the mark 11b of the optical column.

After the alignment between the mask 12 and wafer 14 has been obtained, the step and repeat process is effected by moving the wafer 14 in the X- and Y-directions. For every step, light is projected from the light source 5 to illuminate the mask 12, and a reduced-scale pattern 16 of the mask pattern of the mask 12 is repeatedly projected on the wafer 14 as shown in FIG. 2.

After the exposure is ended, the stage 1 is returned to the initial position (i.e., the position at which the alignment between the wafer 14 and alignment system 6 had been effected), and then the wafer is replaced with a new one. Usually, the mask has one or more chip mask patterns, and the number of patterns 16 projected onto the wafer 14 is thus the product of the number of the chips of the mask and the number of times of repeat.

With the step and repeat exposure system as described above, the area of the wafer 14 on which light is projected in one shot (i.e., pattern 16) is small, the resolution can be very much improved, compared to a one-to-one projection system.

However, the prior art step and repeat exposure method as described above has the following drawback. While the wafer is usually provided with two cross marks as alignment marks as mentioned earlier and shown in FIGS. 1 to 3, the distance l between the two is fixed to a predetermined value peculiar to the exposure apparatus. Such two alignment marks at a fixed distance from each other are given to the wafer by the following method.

At the time of the step and repeat exposure in a first photolithography step (which is usually a step of forming element regions and field regions), two marks 18a and 18b are transferred together with patterns of element regions and field regions to each of predetermined regions 16 of a wafer 14 as shown in FIG. 4B by using a mask 12 as shown in FIG. 4A, which is provided with alignment marks 13a and 13b for alignment with respect to the exposure system, i.e., optical column, and also marks 17a and 17b for transfer to wafer, the marks 17a and 17b being provided in a transfer region. In this case, the distance l between two marks 18a and 18b enclosed in circles as shown in FIG. 4B is ns+t=l where s is the interval of the step (i.e., width 16 of the transfer region) and t is the distance between two marks 18a and 18b in each region 16 (n being the largest integral number meeting l≧ns). Thus, the marks 18a and 18b can be used as alignment marks 15a and 15b of the wafer 14 shown in FIG. 3.

When the ratio l/s is an integral number, t=0. In this case, the marks 17a and 17b of the mask 12 overlap each other. In this case, only a single mark is needed to the transfer region of the mask 12, which is convenient in view of the manufacture of the mask pattern. However, this is a rare case, and usually two marks 17a and 17b have to be provided at a distance of t/α (α being the reduction factor of transfer) in the transfer region of the mask 12. This has been a serious problem in the manufacture of the mask pattern. In the LSI mask pattern, the dimensions of the chip are made as small as possible in order to increase the mass production property and also from the necessity of accommodation in a package of a given size. Therefore, in many cases the surface of the chip is filled with transistors and metallization. For this reason, considerable difficulties are encountered from the IC layout standpoint to find a space for providing a mark at a predetermined distance from the other mark even if the space for providing the other mark is found. Further, as shown in FIG. 4B, there are only two marks that can be used as the alignment marks on the wafer, whereas marks 18a and 18b are provided two for each of the transfer regions 16, most of which are thus unnecessary. This is undesired from the standpoint of reducing the dimensions of the LSI layout.

In order to solve the above problems, it has been the practice to effect photoetching for the formation of the alignment marks prior to the photoetching for the formation of the element regions and field regions. For example, as shown in FIGS. 5A and 5B, an oxide film 19 is grown atop the wafer 14, and an oxide film pattern is formed by transferring a mark pattern only in two regions 16a and 16b where the necessary mark is to be provided. With this oxide film pattern as a mask, the wafer 14 is etched to form engraved alignment marks 15a' and 15b'. By this method, it is no longer necessary to provide marks on chips where transistors or the like are formed. On the demerit side, however, it is necessary to carry out an additional photoetching step.

In the meantime, the characteristics of a semiconductor device often vary depending upon the position of the chip in the wafer or with individual wafers. For this reason, it is important to be able to discriminate the positions of chips in the wafer and also the individual wafers even after division into pellets particularly in a stage of development of a semiconductor device. For example, the length of a gate or the size of Al metallization may vary between a chip from a central portion of a wafer and a chip from an edge portion thereof due to non-uniformity of the thickness of a resist film coated on the wafer surface or the non-uniformity of etching. Further, the stress in the wafer and also accompanying defects vary between the central portion and edge portion of the wafer.

In the prior art method of manufacture of semiconductor devices, however, the same pattern is transferred to all the chips, so that the resultant pellets cannot be distinguished from one another at all. This means that when evaluating the characteristics of a device, it is impossible to know whether the relevant pellet is from the central portion or edge portion of the wafer, and this is an obstacle in the development of devices. A similar obstacle is encountered in case when it is desired to measure differences of the characteristics of individual devices by conducting experiments with different process conditions set for different wafers or different lots because it is impossible to tell which wafers the individual devices are made from.

SUMMARY OF THE INVENTION

An object of the invention is to provide a wafer exposure method, which permits formation of alignment marks only on a necessary transfer region of a wafer.

Another object of the invention is to provide a wafer exposure method, which permits specifying a chip in a wafer.

A further object of the invention is to provide a wafer exposure apparatus which permits formation of alignment marks only on a necessary transfer region of a wafer and specifying a chip in a wafer.

According to the invention, there is provided a wafer exposure method of covering the surface of a wafer with an array of desired chip patterns in a step and repeat process of projecting the desired chip pattern on a wafer by using a mask having the desired chip pattern, in which marks are given to a predetermined region of the wafer by using marking means different from the aforementioned mask.

According to another aspect of the invention, there is provided a wafer exposure apparatus, which comprises a mask for forming chips having a desired chip pattern, an optical column for projecting the chip pattern on a reduced scale onto a wafer, and means for carrying out a step and repeat process on the wafer, and which further comprises means for giving marks to a predetermined region of the wafer.

BRIEF DESCRIPTION OF THE DRAWINGS

FIG. 7 is a plan view showing a wafer having alignment marks provided by the apparatus shown in FIG. 6;

DETAILED DESCRIPTION OF THE PREFERRED EMBODIMENTS

Now, an embodiment of the invention will be described with reference to the drawings.

Figure 1:
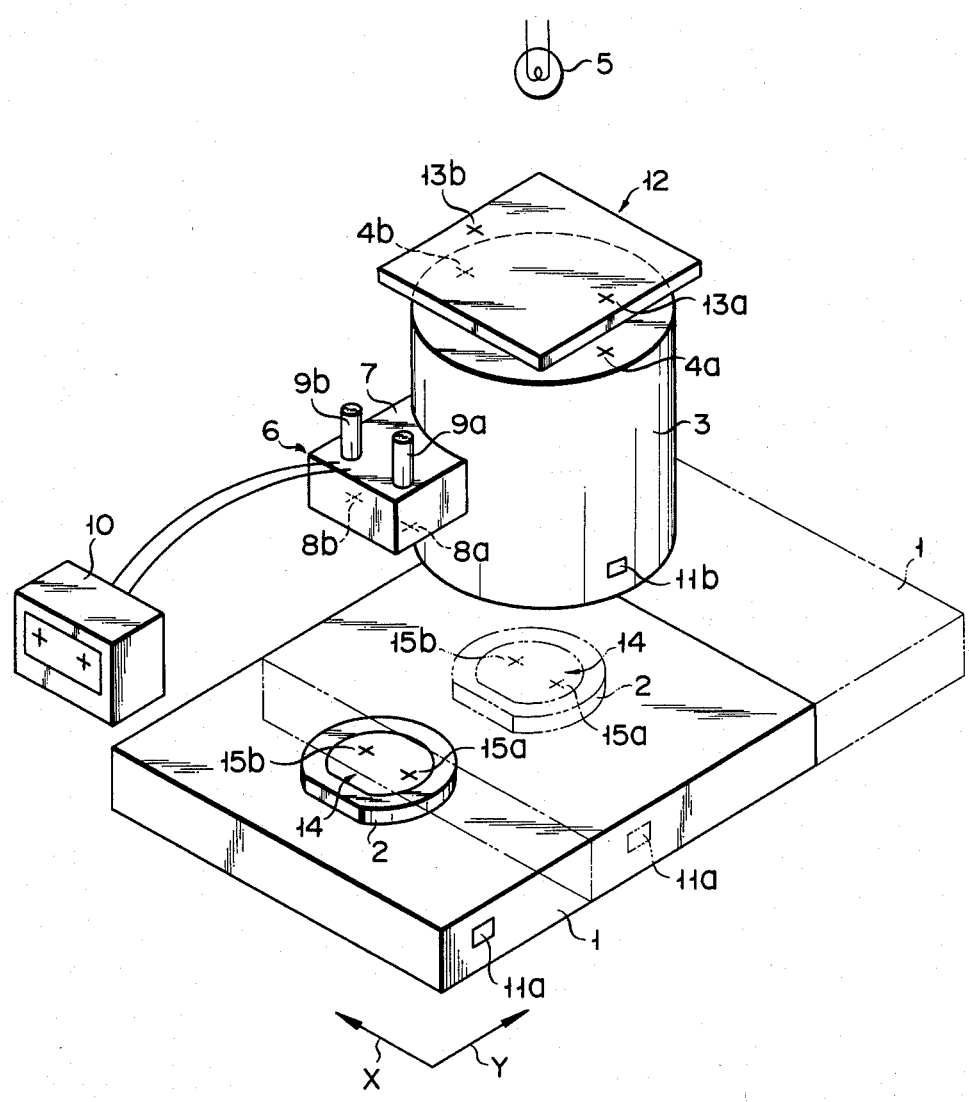
FIG. 1 is a perspective view showing a step and repeat exposure apparatus for a prior art reduction projection system.
Figure 2:
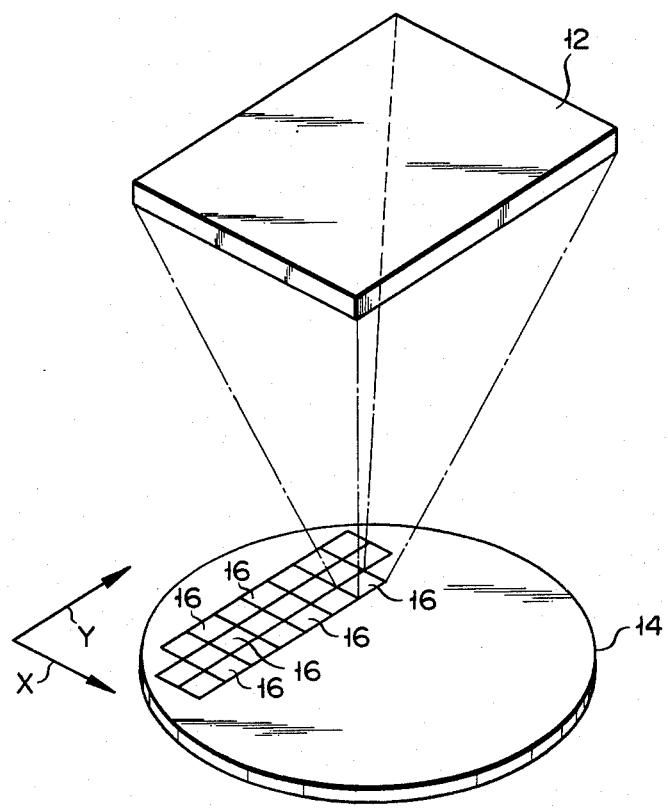
FIG. 2 is a view showing a step and repeat exposure process on a wafer, carried out by the apparatus of FIG. 1.
Figure 3:
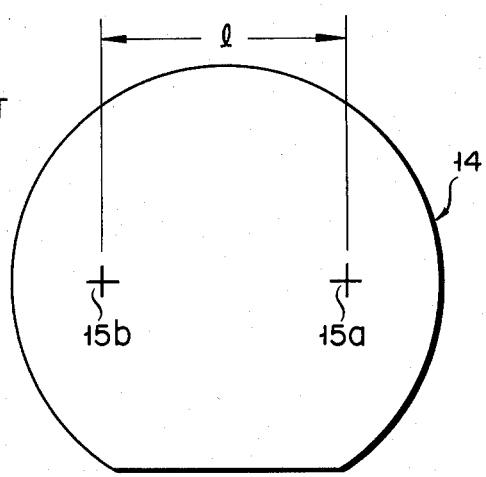
FIG. 3 is a plan view showing a wafer provided with alignment marks.
Figure 4A:
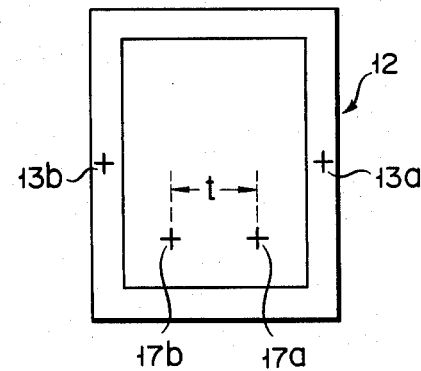
FIGS. 4A and 4B are plan views respectively showing a mask used when forming alignment marks on a wafer by a prior art method and a wafer with alignment marks formed thereon.
Figure 4B:
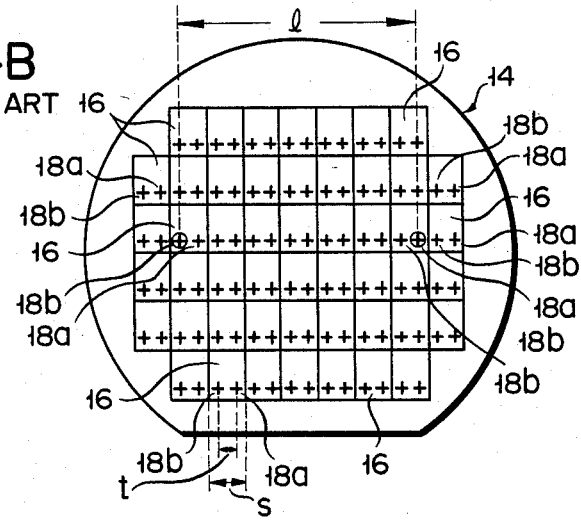
Figure 5A:
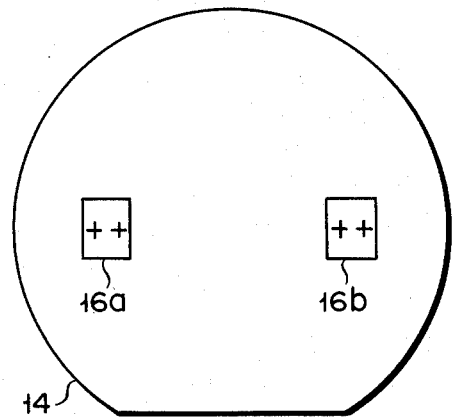
FIG. 5A is a plan view showing a wafer provided with alignment marks formed by a different prior art method.
Figure 5B:
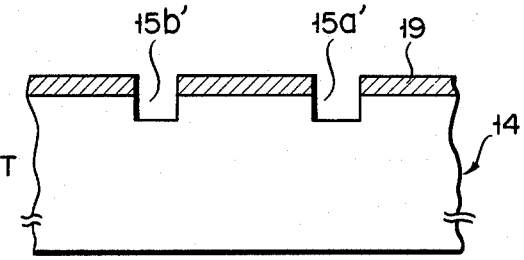
FIG. 5B is a fragmentary sectional view showing the wafer of FIG. 5A.
Figure 6:
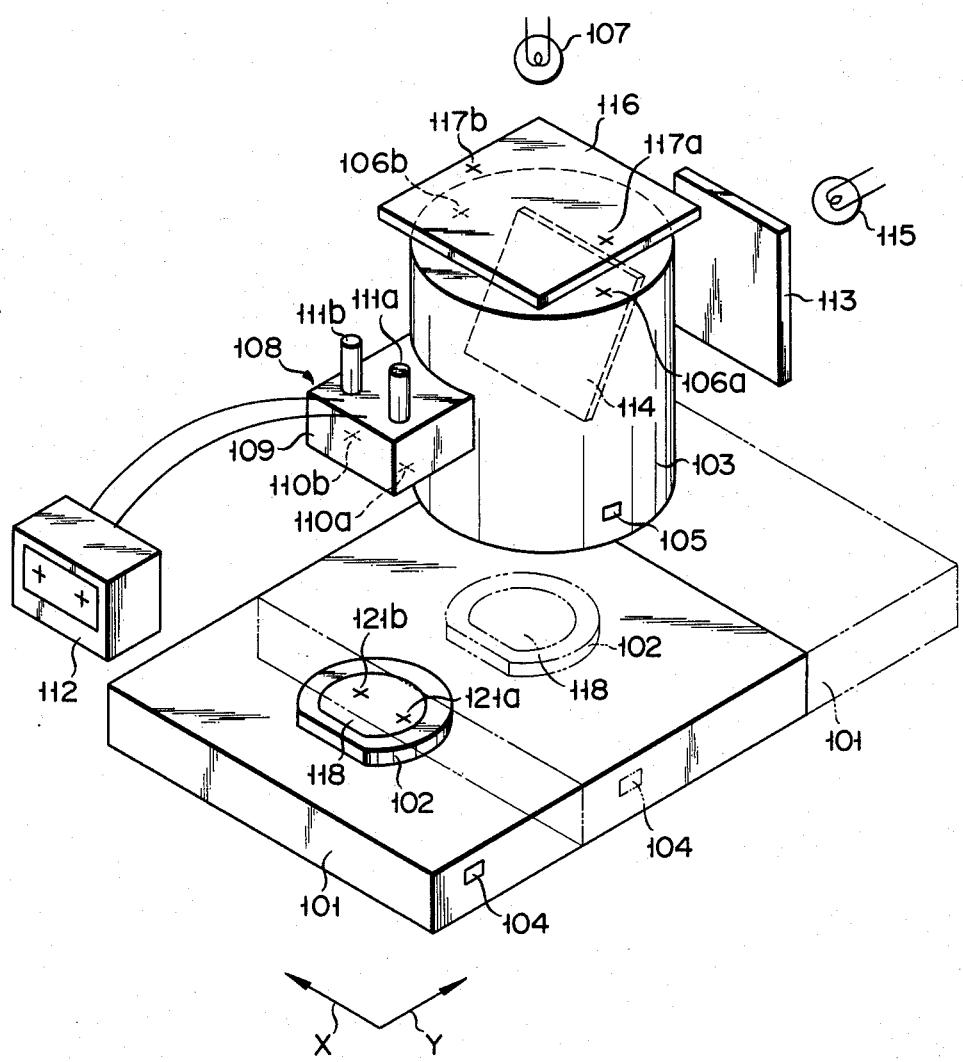
FIG. 6 is a perspective view showing a step and repeat exposure apparatus for a reduction projection system in one embodiment of the invention.

FIG. 6 is a perspective view showing a step and repeat exposure apparatus of a reduction projection type in one embodiment of the invention. In FIG. 6, reference numeral 101 designates a stage movable in X- and Y-directions. To the top of the stage 101 is secured a wafer chuck 102 for holding a wafer 118. Above the stage 101 an optical column 103 is disposed including an optical system for projecting a mask pattern on a reduced scale onto the wafer 118. The side surface of the stage 101 and the side surface of the optical column 103 are provided with marks 104 and 105 for aligning the stage 101 and optical column 103 in the Y-direction. The optical column 103 is provided at its top with marks 106a and 106b, of a cross shape for instance, for being aligned with alignment marks 117a and 117b provided on a mask 116. Right above the optical column 103 a first light source 107 is disposed at a predetermined distance therefrom. The optical column 103 is provided with an alignment system 108 projecting from its side surface.

The alignment system 108 includes a main body 109 having a box-like shape provided at the bottom with marks 110a and 110b for being aligned with alignment marks 121a and 121b of the wafer 102 and microscopes 111a and 111b projecting from the main body 109 for observing the state of alignment between the marks 121a and 121b on the wafer 102 and marks 110a and 110b at the bottom of the main body 109. The alignment system 108 of this construction may be provided with an alignment monitor 112 for observing the state of alignment between the marks 110a and 110b and the alignment marks 121a and 121b of the wafer 102 via a mirror or a half mirror (not shown) provided between the marks 110a and 110b and microscopes 111a and 111b.

At a position at a predetermined distance from the side of the optical column 103 opposite the alignment system 108 there is disposed an alignment mark formation mask 113 extending parallel to a plane in contact with the side of the optical column 103. Inside the optical column 103, there is provided a mirror or a half mirror 114 for reflecting mark pattern light from the mask 113 to a wafer 102 disposed therebelow. A second light source 115 is disposed on the back side of the mask 113. The light source which may be used in the step and repeat exposure of the invention is not limited to a visual light source. Ultraviolet ray source, X-ray source or the like can be employed. The words "optical" and "light" used herein therefore mean ultraviolet rays and X-rays, too.

Now, a wafer exposure method using the step and repeat exposure apparatus described above will be described.

In the first place, the mask 116 for chip formation, which has a desired pattern for forming a corresponding element region or a field region, is aligned with the optical column 103 by aligning the cross-shaped alignment marks 117a and 117b of the chip formation mask 116 with the cross-shaped marks 106a and 106b provided on the top surface of the optical, column 103. Then, the wafer 118 is placed in the wafer chuck 102, and in this state the stage 101 is moved to a position shown by imaginary lines so that the wafer 118 is positioned right beneath the optical column 103. Thereafter, a step and repeat process is carried out on the wafer 118 by moving the stage 101 in the X- and Y-directions. In each step, the optical column 103 transfers a chip pattern on a reduced scale onto the wafer 118 by projecting light from the first light source 107 on the chip formation mask 116. The resulting array of chip patterns is shown in FIG. 7. The transfer of the pattern of the chip formation mask 116 onto the wafer 118 is effected on the transfer regions 120 except for transfer regions 119a and 119b in which the alignment marks are to be formed. After the transfer of the chip patterns onto the wafer 118 is all completed, the stage is moved again as in the step and repeat process, and when it is brought to the alignment mark formation transfer regions 119a and 119b, the optical column 103 transfers the cross-shaped alignment marks 121a and 121b on a reduced scale onto the alignment mark formation transfer regions 119a and 119b of the wafer 118 by reflecting the mark pattern formed by mask 113 and second light source 115 with the mirror or half mirror 114 inside it (see FIG. 6).

Then, the wafer 118 is subjected to a second photoetching process. More particularly, the mask 116 on the optical column 103 is replaced with a gate electrode or Al metallization formation mask. Then, the stage 101 is moved to a position as shown by solid line in FIG. 6, and the cross-shaped marks 121a and 121b that have been provided on the wafer 118 in the aforementioned first photoetching step are aligned to the cross-shaped marks 110a and 110b on the main body 109 by moving the wafer 118 while observing it with the microscopes 111a and 111b. This alignment may be made by using the alignment monitor 112 as well. Since the alignment system 108 is secured to the optical column 103, when the wafer 118 is aligned by the alignment monitor 112, the wafer 118, is aligned to the optical column 103, and hence it is also aligned with the gate electrode formation mask.

After the alignment of the wafer 118 is completed, the stage 101 is moved in the Y-direction along a rail (not shown) for setting again the wafer 118 in a position right beneath the optical column 103. The alignment of the stage 101 and optical column 103 in the Y-direction can be effected with automatic alignment of the marks 104 and 105 provided on the stage 101 and optical column 103 effected by means of a laser interferometer or the like. Then, like the first photoetching step, a step and repeat exposure process on the wafer 118 is carried out to transfer the gate electrode pattern or the like onto the transfer regions 120 which have been subjected to the first photoetching step for the formation of elements as shown in FIG. 7.

With the exposure method described above according to the invention, it is possible to simply and precisely form the alignment marks 121a and 121b used for alignment in a subsequent photoetching step only on the predetermined transfer regions 119a and 119b of the wafer 118. Thus, it is possible to increase the number of chips formed on one wafer and also attain improvement of the LSI mass production capacity.

While in the above embodiment the transfer of alignment marks onto predetermined regions of a wafer by using an alignment mark formation mask has been effected after the transfer of element or field regions onto the wafer by using a chip formation mask, this is by no means limiting, and these steps may be interchanged. As a further alternative, the step and repeat exposure may be carried out by using a chip formation mask, and the transfer of alignment marks may be effected by using the alignment mark formation mask only when the stage is brought to the alignment mark transfer region of the wafer. Further, it is possible to transfer not only the alignment mark but also a chip pattern to the alignment mark transfer region.

Figure 8:
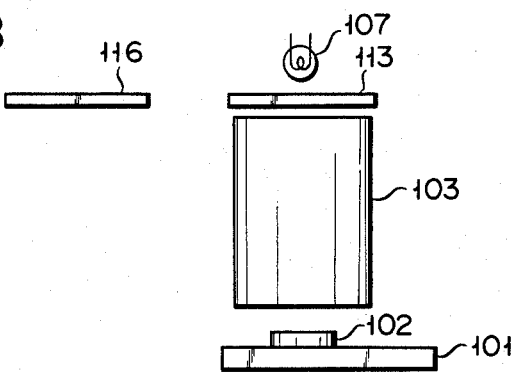
FIG. 8 is a front view showing a modification of the apparatus according to the invention.
Figure 9:
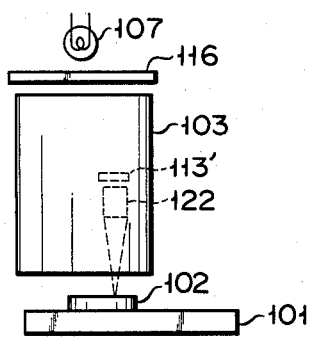
FIG. 9 is a front view showing a further modification of the apparatus according to the invention.
Figure 10:
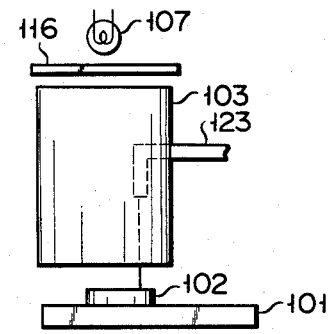
FIG. 10 is a front view showing a still further modification of the apparatus according to the invention.

Further, while in the above embodiment the alignment mark formation mask has been provided on the optical column 103, this is by no means limiting and it is possible to adopt a structure where a chip formation mask 116 and an alignment mark formation mask 113 may be switched one from the other as shown in FIG. 8. Further, it is possible to assemble an alignment mark formation mask 113' and a small exposure system 122 may be assembled in an optical column 103 as shown in FIG. 9. Further, it is possible to assemble a laser beam scanning member 123 (or an electron beam scanning member) in an optical column 103 as shown in FIG. 10, for forming alignment marks by making a resist film coated on the wafer surface or directly engraving the wafer with scanning member 123.

While the above embodiment has been concerned with the case of providing alignment marks to the wafer, it is also possible to provide not only alignment marks but chip specification marks to all the chips or selected chips in the wafer. Now, such an example will be described.

Figure 11:
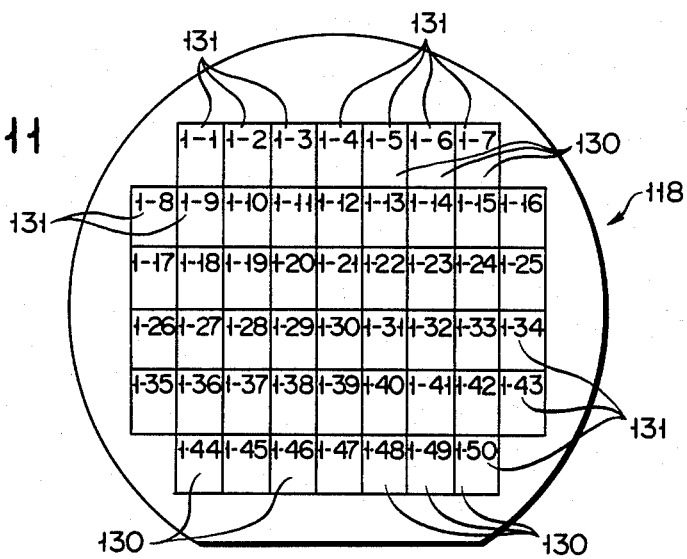
FIGS. 11 and 12 are plan views showing wafers having chip specification marks provided by the apparatus shown in FIG. 6.

In the apparatus shown in FIG. 6, a mask having a pattern constituting a symbol, for instance a numeral, specifying a chip is used in lieu of the alignment mark formation mask 113. This mask has such a structure that its numeral pattern can be freely selected, for instance by shifting numerals in individual digit places. By using such a mask, chip specification symbols or numerals may be provided to the individual chips. For example, when carrying out a step and repeat exposure process for transferring an Al metallization pattern, in each step of the process light is projected from the second light source 115 onto the mask 113 which has a numeral pattern (which is changed such as 1-1, 1-2, 1-3, . . . for the individual steps), and the numeral which progressively changes as 1-1, 1-2, 1-3, . . . is transferred together with the Al metallization pattern through the mirror or the half mirror 114 onto the chip region 130 of the wafer 118 as shown in FIG. 11.

As has been shown above, with the exposure method according to the invention it is possible to provide a chip specification numeral 131 such as 1-1, 1-2, 1-3, . . . at a corner of each of the chip regions 130 of the wafer 118 by using a mask having the chip specification numeral pattern during the step and repeat exposure process for transferring an Al metallization pattern onto each chip region 130 of the wafer 118. Thus, even after a wafer is divided into pellets and these pellets are assembled within a package to complete an LSI, which lot or which part of the wafer each pellet is from can be readily determined by reading out the numeral provided to the pellet. Thus, it is possible to obtain simple and accurate characteristics evaluation of the LSI from the characteristics of the LSI thus obtained and information about the original location of each pellet on the wafer, which greatly contributes to the development of the LSI.

Figure 12:
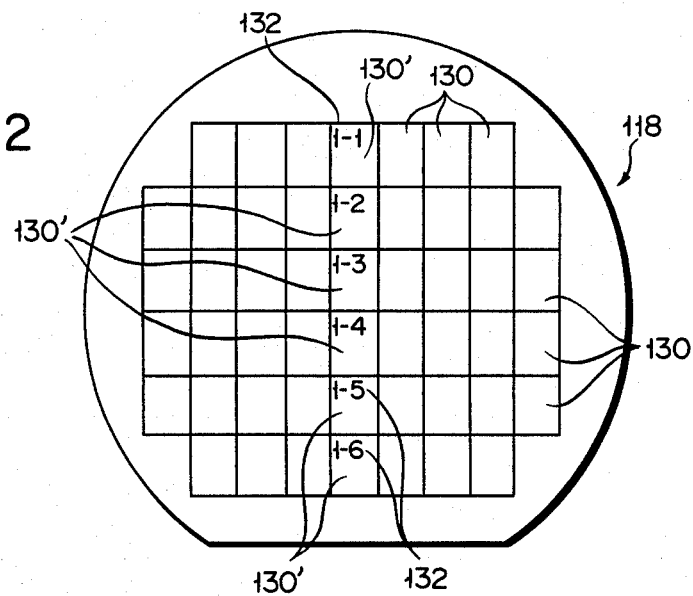

In the above example of providing chip specification numerals all the chips of the wafer have been given numerals. When providing chip specification numerals to eventual product chip regions it is possible to provide numerals such as 1-1, 1-2, . . . only on selected chip regions 130' which regions are utilized for research and investigation of devices, as shown in FIG. 12.

Figure 13A:
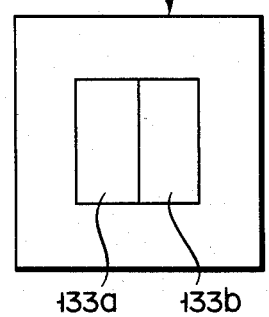
FIGS. 13A and 13B are plan views respectively showing a mask having two chip patterns used in accordance with the method according to the invention and a wafer having chip specification marks formed with chip patterns transferred by using the mask.
Figure 13B:
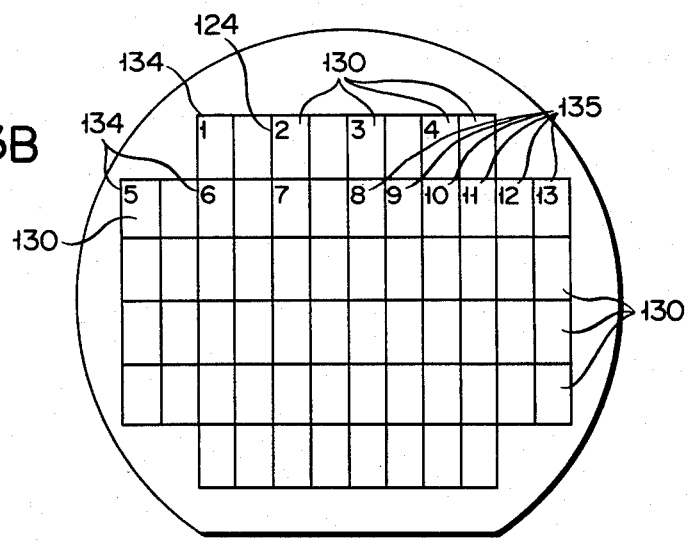

Two chip patterns can be transferred to the wafer in one shot by using a chip formation mask 116' having two or more, for instance two, chip patterns 133a and 133b as shown in FIG. 13A. It is possible to provide every other chip with chip specification numerals such as numerals 1 to 7 or provide each of successive chips with numerals such as numerals 8 to 13 to identify the different chips.

Further, it is possible to provide chip specification marks not only during each step in the step and repeat exposure process of the chip formation mask pattern on the wafer but before or after each step, i.e., during a period between adjacent steps. Further, it is possible to provide chip specification marks to all the chip regions or only given chip regions after chip formation mask patterns have been transferred to all the chip regions of the wafer in a step and repeat exposure process. Further, it is possible to provide chip specification marks in the reverse order, i.e., before the transfer of the chip formation mask pattern.

Further, the transfer of chip specification marks onto chip regions of the wafer may be effected not during the transfer of an Al metallization pattern but during the transfer of patterns other than Al metallization such as field region or gate electrodes. Better discrimination can be obtained by providing chip specification marks to an Al layer during the transfer of the Al metallization pattern.

Further, the transfer of chip specification marks may also be carried out by using the apparatus shown in FIGS. 8 to 10 which are used for the transfer of alignment marks.

Further, the chip specification marks are not limited to numerals but it is possible to provide any other marks such as characters, combinations of characters and numerals, bar patterns, etc. which permit distinguishing chips one from another.

What is claimed is:

1. A wafer exposure apparatus, comprising:
   a chip formation mask having a desired chip pattern;
   a mark formation mask, different from said chip formation mask, having a mark pattern;
   an optical column for projecting said chip pattern on a reduced scale onto a wafer, said mark formation mask being provided on the side of said optical column and said optical column including inner means for projecting said mark pattern of said mark formation mask onto the wafer; and
   means for carrying out a step and repeat exposure process on the wafer.

2. The wafer exposure apparatus of claim 1, wherein said inner means includes an angled mirror positioned within said optical column.

3. A wafer exposure apparatus, comprising:
   a chip formation mask having a desired chip pattern;
   a mark formation mask, different from said chip formation mask, having a mark pattern;
   an optical column for projecting said chip pattern on a reduced scale onto a wafer, said mark formation mask being provided within said optical column and said optical column including a small optical system for projecting said mark pattern of said mark formation mask onto the wafer; and
   means for carrying out a step and repeat exposure process on the wafer.

* * * * *